United States Patent [19]
Baek

[11] Patent Number: 5,929,798
[45] Date of Patent: Jul. 27, 1999

[54] HIGH SPEED AND LOW POWER DIGITAL/ANALOG (D/A) CONVERTER USING DUAL CURRENT CELL ARRAYS

[75] Inventor: Daebong Baek, Anyang, Rep. of Korea

[73] Assignee: LG Semicon Co., Ltd., Cheongju, Rep. of Korea

[21] Appl. No.: 08/965,450

[22] Filed: Nov. 6, 1997

[30] Foreign Application Priority Data

Nov. 8, 1996 [KR] Rep. of Korea ............ 96-52790

[51] Int. Cl.⁶ .................................. H03M 1/66
[52] U.S. Cl. .......................... 341/153; 341/141
[58] Field of Search .................... 341/141, 144, 341/145, 153

[56] References Cited

U.S. PATENT DOCUMENTS

| | | | |
|---|---|---|---|
| 4,430,642 | 2/1984 | Weigand et al. | 341/141 |
| 4,503,421 | 3/1985 | Hareyama et al. | 341/145 |
| 4,904,922 | 2/1990 | Colles | 323/316 |
| 4,910,514 | 3/1990 | Imer et al. | 341/144 |
| 5,689,259 | 11/1997 | Ozguc | 341/145 |

*Primary Examiner*—Howard L. Williams
*Attorney, Agent, or Firm*—Fleshner & Kim

[57] ABSTRACT

A high speed and low power D/A converter which is capable of accurately outputting an analog value and implementing a high speed operation by reducing noise and errors during the conversion. The converter includes an upper current cell plate for forming analog voltages from a 126th level to a 255th level in accordance with decoding of inputted digital values by a first column decoder and a first row decoder, a lower current cell plate for forming analog voltages from a 0th level to a 125th level in accordance with decoding of the inputted digital values by a second column decoder and second row decoder, and a multiplexer for selectively outputting the analog voltage from the upper current cell plate or the lower current cell plate in accordance with a binary bit value of a most significant bit (MSB) of the inputted digital signal.

5 Claims, 2 Drawing Sheets

HIGH SPEED AND LOW POWER DIGITAL/ ANALOG (D/A) CONVERTER USING DUAL CURRENT CELL ARRAYS

BACKGROUND OF THE INVENTION

1. Field of the Invention

The present invention relates to a high speed and low power D/A converter, and in particular to a high speed and low power D/A converter which is capable of accurately outputting an analog value and implementing a high speed operation by reducing noise and errors which occur during a code conversion.

2. Description of the Conventional Art

FIG. 1 illustrates the construction of a conventional 8-bit CMOS D/A converter which includes a column decoder 1 and a row decoder 2 receiving predetermined bit signals among 8-bit input signals, and a cell plate (matrix array) 3 having a plurality of current cells and outputting a predetermined level of current in accordance with the output signals from the column decoder 1 and the row decoder 2.

Here, each current cell is composed of a logic gate and a current source. The current level outputted by each current cell is identical (equally weighted).

The operation of the conventional 8-bit CMOS D/A converter will now be explained with reference to FIG. 1.

First, when 8-bit (B0–B7) digital signals are inputted, the column decoder 1 and the row decoder 2 decode predetermined bit signals among the 8-bit input signals for thus turning on the current sources of the current cells. When the current from the turned-on current sources flows through an externally connected load resistor R, an analog output voltage Vout is outputted in a voltage-dropped form.

Thus, in the case of converting 8-bit signals, it is possible to implement a total of $2^8=256$ discrete current levels.

When the current cells are equally weighted, namely, when the current cell plate 3 is composed of segmented cells, the current cells of the cell plate 3 are sequentially selected by adjusting the 8-bit input value, and then the current levels flowing from the selected current cells are combined, so that the amount of current outputted is monotonically increased from the 1st level to the 256th level. As a result, whenever one current cell is turned on, the currents from the current source are combined, so that it is possible to obtain an analog signal level which ranges from 1 to 256 steps.

When the current cells are differently weighted, namely, the current cells are weighted in steps of 1, 2, 4, 8, 16, . . . , n, the current cells are not sequentially turned on. Namely, the appropriately weighted current cells are selected for thus implementing a corresponding level.

Namely, in order to implement an analog level of 32, only the current cells corresponding to analog output level of 32 are turned on, and the other current cells are all turned off, for thus implementing an appropriate level output.

The conventional D/A converters have various problems, among is in providing a monotonic characteristic, namely, that as the digital value is increased, the analog value must correspondingly steadily increase.

In other words, the monotonic characteristic means that as a digital information value is gradually increased, the analog value is gradually increased without any decrease or nonlinearity. Therefore, when the DIA converter is used in a display system such as a digital television or a high definition television, the monotonic characteristic is a very important factor. In order to obtain a good monotonic characteristic, a desired linear characteristic must be obtained when converting digital signals into analog signals.

When configuring the current cells of the cell plate 3 using segmented cells, since the current cells are turned on one by one in order to obtain a predetermined analog level, it is possible to obtain a monotonic characteristic. However, the configuration and coding operation of the current cells become complicated, the power consumption is increased, and the conversion speed of the circuit is decreased.

In addition, when configuring the current cells of the cell plate 3 using weighted cells, the coding operation and cell configuration are more easily implemented. However, it is difficult to obtain a desired monotonic characteristic.

Therefore, the segmented cells and the weighted cells are used together in order to overcome the above-described problems. In this case, as the number of bits of the D/A converter is increased, the role of the weighted cells is increased. Therefore, it becomes still difficult to obtain a desired monotonic characteristic.

The second problem is in that much noise may be generated during code conversion.

When a digital value is increased by one binary digit, for example, the binary value to be converted changes from 01111111 into 10000000, as the binary value is changed from 0 to 1 or from 1 to 0 at each digit position, a discontinuity problem occurs due to noise which is generated during a short time.

Furthermore, since the D/A converter is operated at about 100 MHz or higher, such noise increases a delay time, which is required until a stable analog signal level is obtained, namely, a settling time, thus limiting the data conversion speed.

SUMMARY OF THE INVENTION

Accordingly, it is an object of the present invention to provide a high speed and low power D/A converter which overcomes the aforementioned problems encountered in the conventional art.

It is another object of the present invention to provide an improved high speed and low power D/A converter which is capable of accurately outputting an analog value and implementing a high speed operation by reducing noises and errors during a code conversion.

To achieve the above objects, there is provided a high speed and low power D/A converter which includes an upper cell plate from forming analog voltages of a 126th level to 1 255th level in accordance with decoding of inputted digital data values by a first column decoder and a first row decoder, a lower current cell plate for forming analog voltages of a 0th level to a 125th level in accordance with decoding of the inputted digital data values by a second column decoder and second row decoder, and a multiplexer for selectively outputting the analog voltages from the upper current cell plate or the lower current cell plate in accordance with a binary bit value of a most significant bit (MSB) of the inputted digital data.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 2:
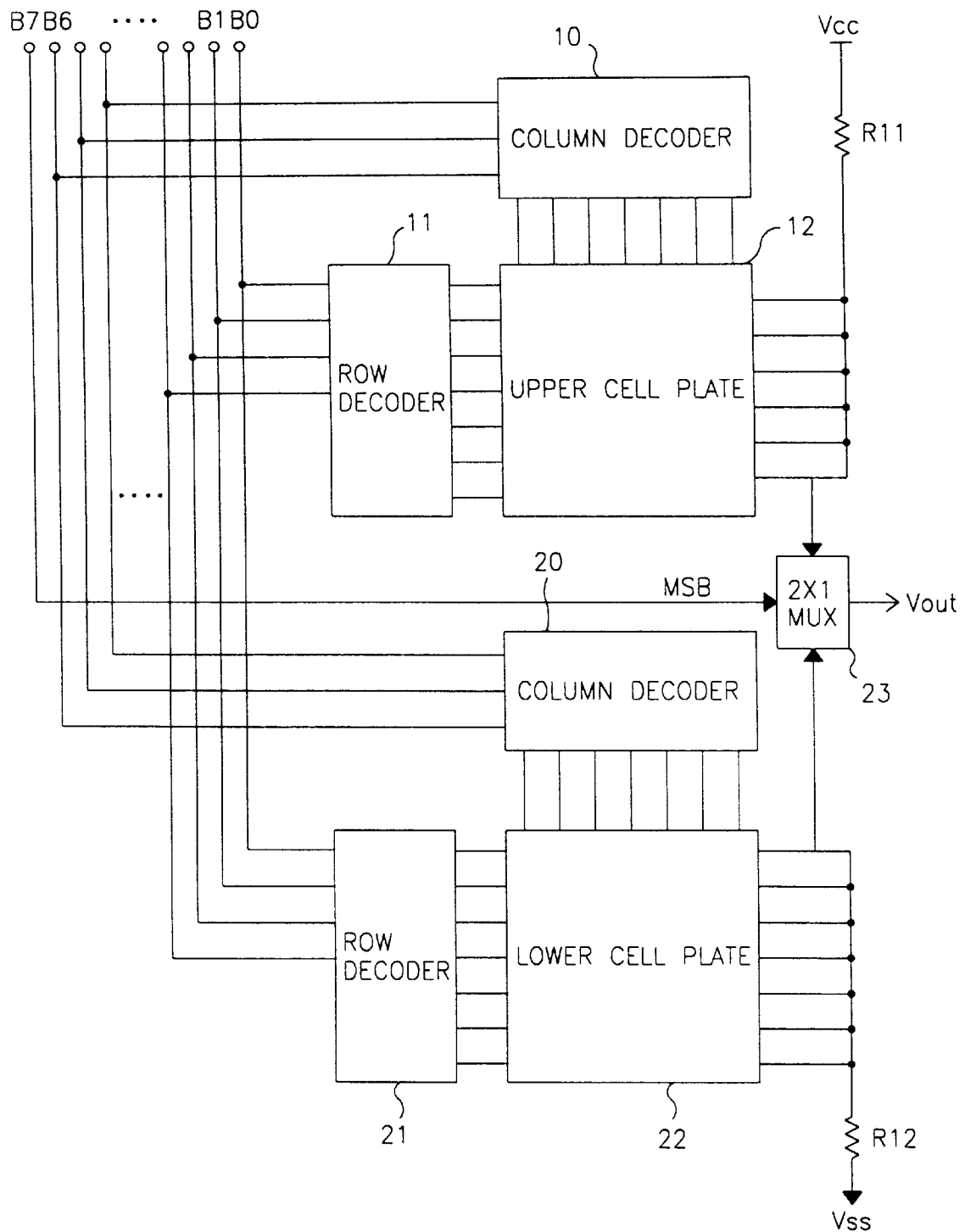
FIG. 2 is a schematic block diagram illustrating the D/A converter according to the present invention.

FIG. 2 illustrates the D/A converter according to the present invention which includes an upper current cell plate 12 and a lower current cell plate 22 which are independently operated in accordance with the value of input data bit B7 which is the is MSB (Most significant Bit) of the inputted 8-bit data B0–B7.

Figure 1:
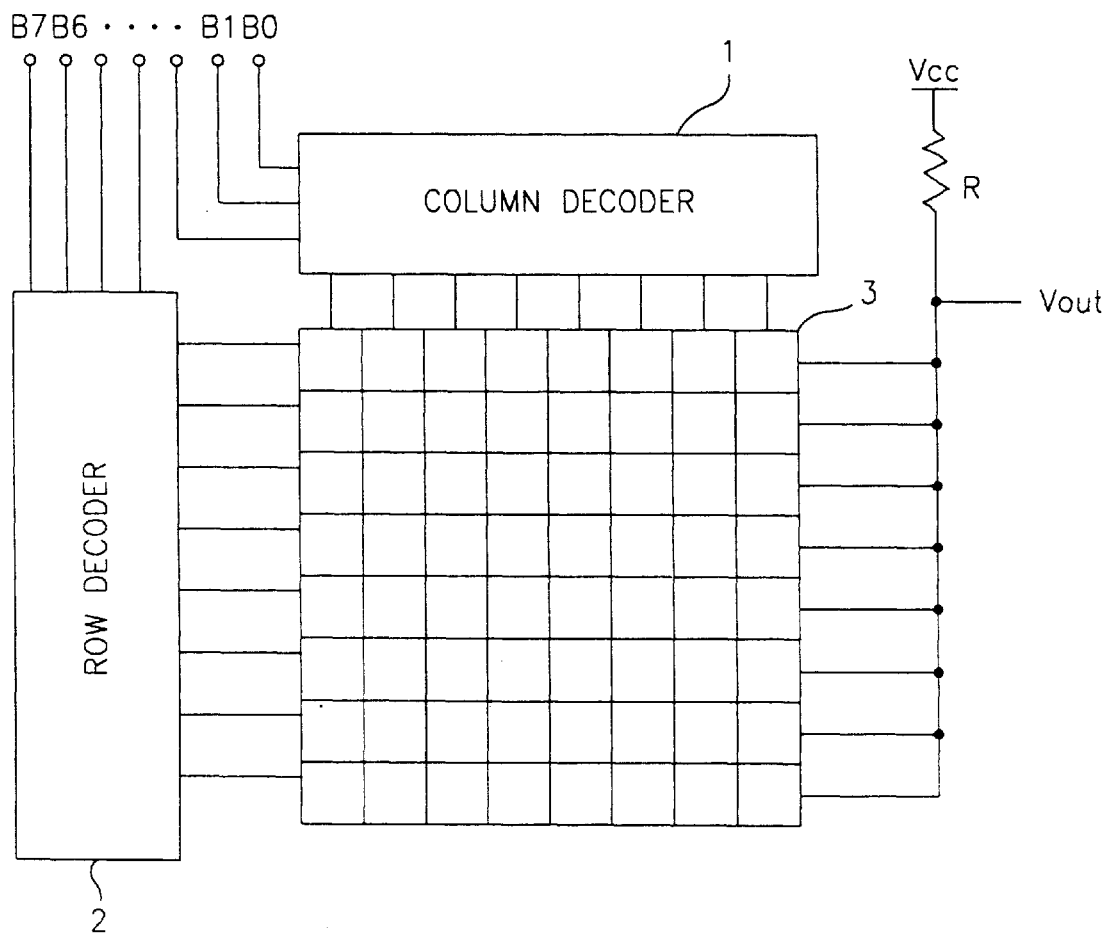
FIG. 1 is a schematic block diagram illustrating a conventional 8-bit D/A converter.

The upper first plate 21 forms across a resistor R11 analog voltages ranging in level from a 126th level to a 256th level in accordance with the decoding of the inputted digital data B0–B6 values by a column decoder 10 and a row decoder 11, and the lower cell plate 22 forms across a resistor R12 analog voltages ranging in level from 0th level to a 125th level in accordance with the decoding of the inputted digital data B0–B6 by a column decoder 20 and a row decoder 21. A multiplexer 23 selects the voltage outputted by upper current cell plate 10 or the voltage outputted by lower current cell plate 11 in accordance with the value of MSB B7. Here, the other construction details of the D/A converter are configured identically with the conventional converter shown in FIG. 1.

The operation of the 8-bit D/A converter according to the present invention will now be explained.

First, when an 8-bit (B0–B7) digital value is inputted, the voltage developed across resistor R11 by the upper current cell plate 12 or the voltage developed across resistor R12 by the lower current cell plate 22 are selected by the multiplexer 23 developing upon the bit (B7) value, which is the MSB thereto, namely, 1 or 0.

The column decoders 10 and 20 respectively receive binary bit values B4, B6, and the row decoders 11 and 21 respectively receive binary bit values B0–B3, so that the current sources of the corresponding current cells are turned on. The current from the thusly turned-on current sources flows through the externally connected load resistors R11 and R12, so that respective analog output voltages are obtained as the voltage drops across R11 and R12. As a result, a predetermined voltage level among a 126th level to a 255th level is applied to the multiplexer 23 from the upper current cell plate 12 via resistor R11, and a predetermined voltage level among a 0th level to a 125th level is applied to the multiplexer 23 from the lower current cell plate 22 via resistor R12.

At this time, assuming the inputted bit value B7 is 1, the voltage applied from the upper plate 12 is selected and outputted by the multiplexer 23, and when the inputted bit value B7 is 0, the voltage applied from the lower plate 22 is selected and outputted.

For example, when configuring an 8-bit D/A converter of Vcc=5V, since the bit B7, which is the MSB, among the binary input bits of B7–B0 selects the voltage outputted from the upper cell plate 12 or from the lower cell plate 22, each cell plate needs implement only 126 discrete current levels, so that the number of weighted cells may be reduced by half.

As a result, in the present invention, since it is possible to reduce the number of the weighted cells, the error rate may be reduced by half. In addition, since the MSB which is most weighted is implemented by the coding value (0 or 1), it is possible to reduce noise during the conversion. Furthermore, because the number of current source cells which are used for generating high level analog signals is reduced by half, the power consumption is significantly reduced.

In more detail, if a 16-bit weighted cell is used in the conventional art, in the present invention, since an 8-bit weighted cell is used, it is possible to reduce an error rate by half in view of obtaining the monotonic characteristic.

In addition, since the MSB (B7) is used only as a control signal for the multiplexer 23, namely, the MSB (B7) is not used for controlling the weighted cells, the signal bits actually converted range from 0111111 to 1000000, which is a 7-bit signal form, so that it is possible to reduce the noise by half and the operational speed is increased compared to the conventional art.

As described above, in the present invention, the current cell plate of the conventional art is divided into an upper current cell plate for forming analog voltages of a 126th level to a 255th level and a lower current cell plate for forming analog voltages of a 0th level to 125th level. Therefore, since the output signal from each current cell plate is selected using the MSB, the number of weighted cells necessarily is decreased by half, so that it is possible to significantly reduce the error occurrence rate, noise and power consumption.

Although the preferred embodiment of the present invention has been disclosed for illustrative purposes, those skilled in the art will appreciate that various modifications, additions and substitutions are possible, without departing from the scope and spirit of the invention as recited in the accompanying claims.

What is claimed is:

1. A D/A (digital/analog) converter, comprising:
   an upper current cell plate for forming analog voltages of a 126th level to a 255th level in accordance with decoding of inputted digital signal values by a first column decoder and a first row decoder;
   a lower current cell plate for forming analog voltages of a 0th level to a 125th level in accordance with decoding of the inputted digital signal values by a second column decoder and a second row decoder; and
   a multiplexer for selectively outputting the analog voltages formed by the upper current cell plate or the analog voltages formed by the current cell plate in accordance with a binary bit value of a most significant bit (MSB) of the inputted digital signal.

2. The converter of claim 1, wherein a current output terminal of the upper current cell plate is connected with a supply voltage Vcc circuit through a load resistor.

3. The converter of claim 1, wherein a current output terminal of the lower current cell plate is connected to a ground voltage Vss circuit through a load resistor.

4. The converter of claim 1, wherein the inputted digital signal values decoder and applied to the upper current cell plate and the lower current cell plate are formed of the less significant bits of the inputted digital signal to be converted, excluding the most significant bit (MSB) thereof.

5. A D/A (digital/analog) converter, comprising:
   an upper current cell plate for forming analog voltages of a $2^N/2$th level to a $2^N$th level in $2^N$ voltage levels in accordance with decoding of inputted digital signal values by a first column decoder and a first row decoder;
   a lower current cell plate for forming analog voltages of a 0th level to a $(2^N/2)$-1th level in $2^N$ voltage levels in accordance with decoding of the inputted digital signal values by a second column decoder and a second row decoder; and a multiplexer for selectively outputting the analog voltages formed by the upper current cell plate or the analog voltages formed by the current cell plate in accordance with a binary bit value of a most significant bit (MSB) of the inputted digital signal.

* * * * *